United States Patent
Sze et al.

(10) Patent No.: US 7,569,912 B2
(45) Date of Patent: Aug. 4, 2009

(54) DIFFERENTIAL VARIABLE CAPACITORS AND THEIR APPLICATIONS

(75) Inventors: Bour-Yi Sze, Taipei (TW); Felix Kao, Taipei (TW); Chih-Long Ho, Taipei (TW)

(73) Assignee: Via Technologies, Inc., Taipei (TW)

( * ) Notice: Subject to any disclaimer, the term of this patent is extended or adjusted under 35 U.S.C. 154(b) by 385 days.

(21) Appl. No.: 11/420,118

(22) Filed: May 24, 2006

(65) Prior Publication Data

US 2006/0214264 A1  Sep. 28, 2006

Related U.S. Application Data

(63) Continuation-in-part of application No. 11/048,151, filed on Jan. 31, 2005, now Pat. No. 7,298,225, and a continuation-in-part of application No. 10/780,712, filed on Feb. 19, 2004, now abandoned.

(60) Provisional application No. 60/599,260, filed on Aug. 4, 2004.

(51) Int. Cl.
*H01L 29/72* (2006.01)

(52) U.S. Cl. .............. 257/595; 257/296; 257/312; 257/532; 331/117 FE; 331/167; 331/177 R

(58) Field of Classification Search .......... 257/296, 257/312, 532, 595; 331/117 FE, 167, 177 R
See application file for complete search history.

(56) References Cited

U.S. PATENT DOCUMENTS 6,521,939 B1 *  2/2003  Yeo et al. ............. 257/312
7,005,936 B2 *  2/2006  Tanzawa .............. 331/176

* cited by examiner

*Primary Examiner*—Edward Wojciechowicz
(74) *Attorney, Agent, or Firm*—Thomas, Kayden, Horstemeyer & Risley

(57) ABSTRACT

An integrated circuit design for differential variable capacitors uses an integration method to integrate an integrated circuit having differential variable capacitors as a whole, and takes the parasitic effect into consideration for the manufacturing process to lower the circuit inaccuracy and reduce the chip size effectively. Such arrangement lowers the manufacturing cost, identifies the quality of loading quality of the overall variable capacitance during the manufacture, and further controls the quality of loading capacity of the overall variable capacitance effectively. Furthermore, this invention does not need to reposition for the symmetrical position of the coils, and thus giving a very precise positioning to reduce the level of difficulty for the manufacture.

10 Claims, 5 Drawing Sheets

DIFFERENTIAL VARIABLE CAPACITORS AND THEIR APPLICATIONS

CROSS REFERENCE TO RELATED APPLICATIONS

This application is a continuation-in-part of and claims priority to U.S. application Ser. No. 10/780,712 filed on Feb. 19, 2004, now pending, which claims priority to Taiwan application no. 92136464 filed Dec. 23, 2003, and a continuation-in-part of and claims priority to U.S. application Ser. No. 11/048,151 filed on Jan. 31, 2005, now pending, which claims priority to of U.S. Provisional Patent Application Ser. No. 60/599,260, filed on Aug. 4, 2004, and entitled "HIGHLY LINEAR SIGNAL MODULATION VOLTAGE-CONTROLLED OSCILLATOR". This application claims priority to each of the applications mentioned above.

BACKGROUND OF THE INVENTION

1. Field of the Invention

The present invention relates to an integrated circuit design for differential variable capacitors, more particularly to an integrated circuit being integrated with differential variable capacitors and having no asymmetric coil for reducing the chip size, lowering the circuit inaccuracy, and controlling the overall loading quality of variable capacitors effectively.

2. Description of the Related Art

A voltage control oscillator (VCO) is an important circuit indispensable to the applications of radio frequency (RF)/ microwave and wireless communication, which uses a voltage to enable the variable capacitor therein to vary its capacitance, and thus further changes the oscillating frequency.

More and more people adopt differential circuit design for the circuit of voltage control oscillators (VCO) to reduce the interference caused by common-mode noises. To achieve the differential effect, differential variable capacitors become an essential component. However, the conventional differential variable capacitor usually consists of two independent capacitors, and such arrangement not only increases the chip size, but also enhances a circuitry inaccuracy due to the parasitic effect occurring between the two independent capacitors.

As seen in FIGS. 1A and 1B, a conventional differential variable capacitor is consisted of a first capacitor 1 and a second capacitor 2. The circuit design of the conventional differential variable capacitor is as following: respectively forming n+ implant points 12, 22 in n-well regions 11, 21 on p-type substrates 10, 20; connecting the n+ implant points 12, 22 to form a voltage control point Vc; employing P1 and P2 as the contacts for connecting to other circuits; and employing p+ implant points 13, 23 as the grounding point.

In view of the circuit design of the conventional differential variable capacitor, there exists at least the following shortcomings:

1. The conventional differential variable capacitor adopts two independent capacitors. Therefore, a larger chip is required for the making of the differential variable capacitor such that the manufacturing cost is increased.

2. Parasitic effects will occur at the connection between the two independent variable capacitors of the conventional differential variable capacitor, and thus increasing the circuitry inaccuracy.

3. Since the connection between two variable capacitors must be symmetrical, therefore the positioning has to be very precise, and thus increasing the level of difficulty of the manufacture.

4. Asymmetry usually occurs in the connection between the two variable capacitors, and thus greatly reducing the differential effect.

5. In the conventional differential variable capacitor, there is no way of knowing the factor of overall loading quality of the variable capacitor.

BRIEF SUMMARY OF INVENTION

Accordingly, the present invention provides an integrated circuit design of a differential variable capacitor, which comprises: a p-type substrate; an n-well region disposed on the top surface of the p-type substrate; at least three n-type ion implant regions, each disposed on the top surface of the n-well region; a voltage control terminal, coupled to the n-type ion implant region; a first gate; and a second gate; wherein the first gate and second gate use the voltage control terminal as center to be disposed symmetrically on both sides of the voltage control terminal.

Similarly, the present invention also provides an integrated circuit design of a differential variable capacitor, which comprises: an n-type substrate; a p-well region disposed on the top surface of the n-type substrate; at least three p-type ion implant regions, each disposed on the top surface of the p-well region; a voltage control terminal, coupled to the p-type ion implant region; a first gate; and a second gate being; wherein the first gate and second gate use the voltage control terminal as center to be disposed symmetrically on both sides of the voltage control terminal.

Accordingly, the present invention provides a symmetrical voltage controlled oscillator (VCO) system with a differential variable capacitor. The VCO system comprises a frequency tuning circuit and a core circuit for providing an oscillation mechanism. The frequency tuning circuit and the core circuit are coupled in parallel between the first terminal and the second terminal. Besides, the circuit elements of the VCO system are symmetrically arranged. The frequency tuning circuit has a differential variable capacitor disposed within for receiving a predetermined tuning signal for altering capacitances of the differential variable capacitor. The differential variable capacitor comprises a semiconductor substrate, a deep-implant region, at least three light-implant regions coupling together to a voltage control terminal, a first gate on the deep-implant region connecting to the first terminal, and a second gate on the deep-implant connecting to the second terminal.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
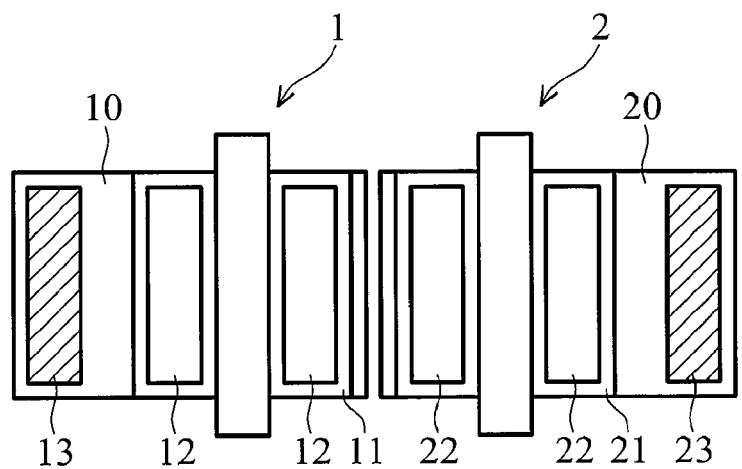
FIG. 1A is a top view of a conventional differential variable capacitor.
Figure 1B:
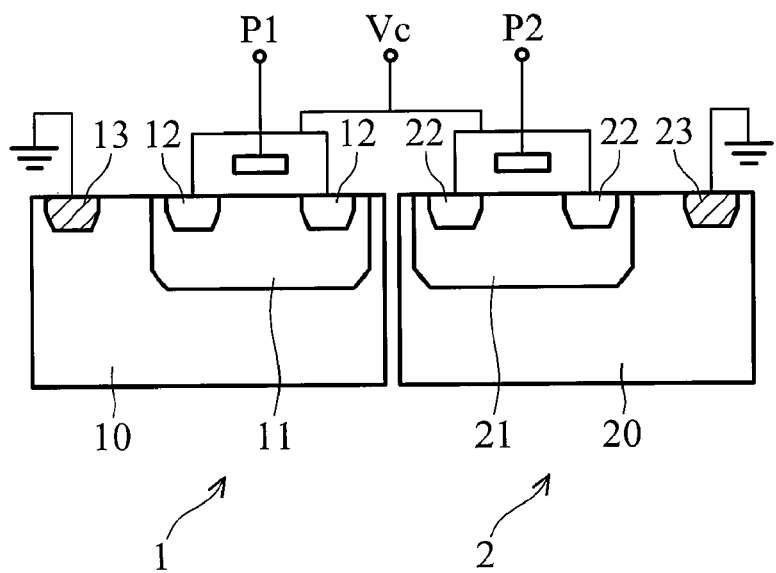
FIG. 1B is a cross-sectional view of a conventional differential variable capacitor.
Figure 2A:
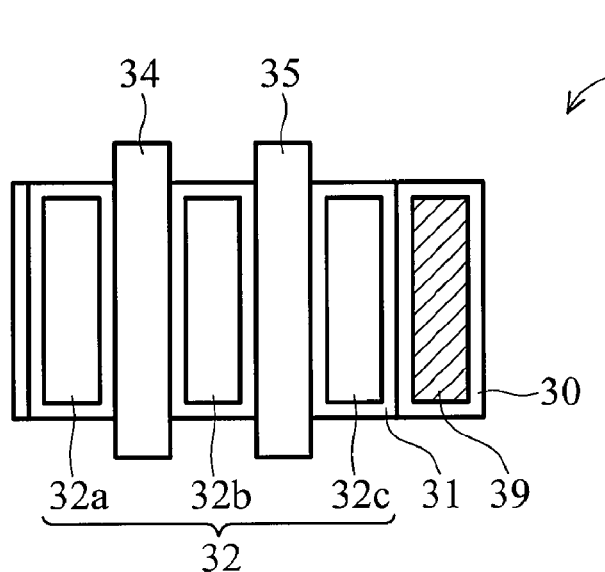
FIG. 2A is a top view of a differential variable capacitor according to a first preferred embodiment of the present invention.
Figure 2B:
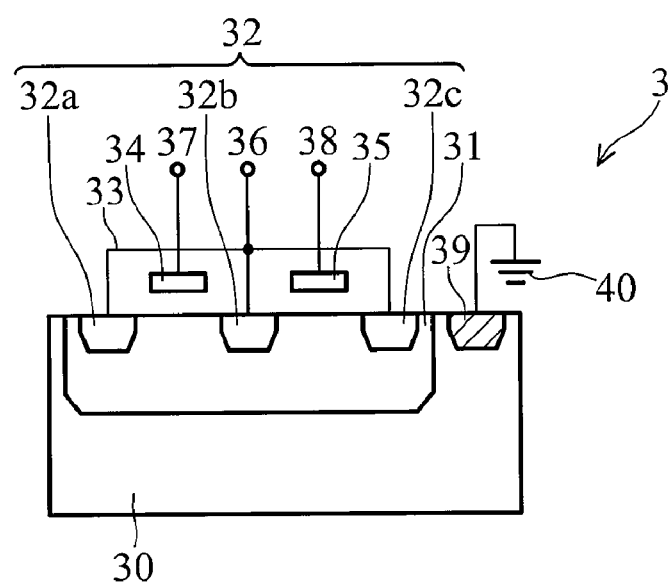
FIG. 2B is a cross-sectional view of a differential variable capacitor according to a first preferred embodiment of the present invention.

Please refer to FIGS. 2A and 2B for the top view and cross-sectional view of a preferred embodiment of the present invention respectively. A differential variable capacitor 3 has an n-well region 31 and at least three n-type ion implant regions 32 disposed on the top surface of the n-well region 31. The n-well region 31 is formed by an ion implant method to dope impurities into a p-type substrate. Beside, the p-type substrate may be formed by doping the ACCEPTOR impurities into the silicon substrate. The n-type ion implant regions 32 include a first n-type ion implant region 32a, a second n-type ion implant region 32b, and a third n-type ion implant region 32c; wherein the first n-type ion implant region 32a and the third n-type ion implant region 32c use the second n-type ion implant region 32b as the center to be disposed symmetrically on both sides of the second n-type ion implant region 32b. Since the relative positions of the first n-type ion implant region 32a, second n-type ion implant region 32b, and third n-type ion implant region 32c can be confirmed in the ion implantation, so that the differential variable capacitor 3 is designed as a whole, which no longer needs to reposition for the symmetric connection.

The conventional lithographic and etching technologies are used to form a structure using the contact point of an oxide layer to connect the connecting points and metal wire; wherein the metal wire 33 connects the foregoing n-type ion implant region 32b; the first gate 34 is disposed in the metal wire 33 and between the first n-type ion implant region 32a and the second n-type ion implant region 32b; the second gate 35 is also disposed in the metal wire 33 and between the second n-type ion implant region 32b and the third n-type ion implant region 32c; the voltage control point 36 is coupled to the first n-type ion implant region 32a, the second n-type ion implant region 32b, and the third n-type ion implant region 32c; the first connecting point 37 is coupled to the first gate 34; the second connecting point 38 is coupled to the second gate 35, wherein the first connecting point 37 and the second connecting point 38 use the voltage control point 36 as the center to be disposed symmetrically on both sides of the voltage control point 36.

Since the differential variable capacitor 3 is designed as a whole, therefore asymmetric coils will not occur, and we can know about the factor of overall loading quality of the variable capacitor to effectively control the overall loading quality of the variable capacitor. Further, the p-type substrate at its top surface further comprises a p-type ion implant region 39 coupled to a grounding point 40 for the purpose of grounding. The first gate 34 and the second gate 35 according to a preferred embodiment of the present invention is made of a poly-silicon material.

Figure 3A:
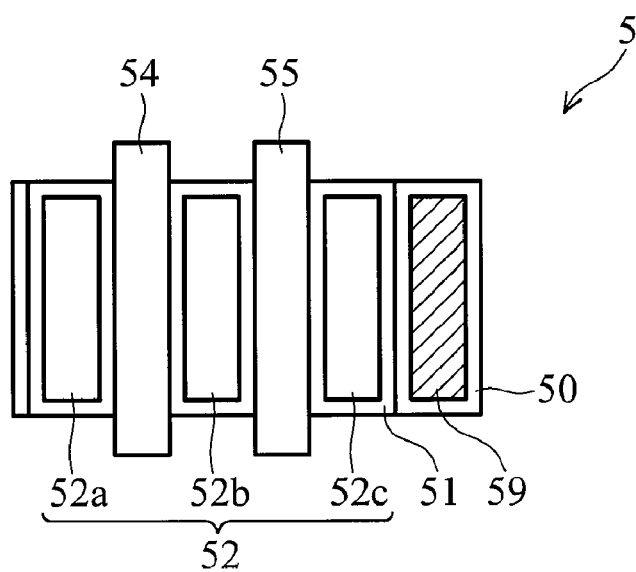
FIG. 3A is a top view of a differential variable capacitor according to a second preferred embodiment of the present invention.
Figure 3B:
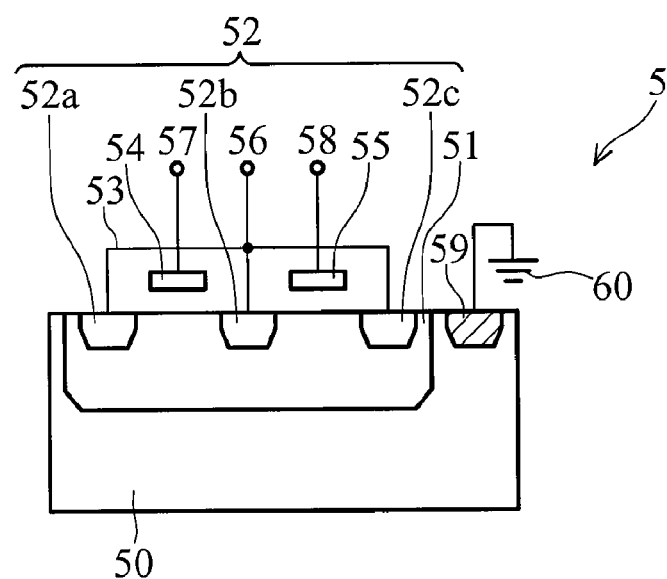
FIG. 3B is a cross-sectional view of a differential variable capacitor according to a second preferred embodiment of the present invention.

Please refer to FIGS. 3A and 3B for the top view and the cross-sectional view according to a second preferred embodiment of this invention respectively, wherein the integrated circuit of the differential variable capacitor 5 forms a p-well region 51 at the top surface of an n-type substrate 50. Similarly, the n-type substrate 50 may be formed by doping the DONOR impurities into a semiconductor substrate. The differential variable capacitor 5 also uses at least three p-type ion implant regions 52 disposed on the top surface of the p-well region 51. The three p-type ion implant regions 52 include a first p-type ion implant region 52a, a second p-type ion implant region 52b, and a third p-type ion implant region 52c, wherein the first p-type ion implant region 52a and the third p-type ion implant region 52c use the second p-type ion implant region 52b as the center to be disposed symmetrically on both sides of the second p-type ion implant region 52b. Since the positions of the first p-type ion implant region 52a, the second p-type ion implant region 52b, and the third p-type ion implant region 52c are confirmed during the ion implantation, so that the differential variable capacitor 5 is designed as a whole, and does not require repositioning for the symmetrical connection at a later manufacturing process.

The conventional lithographic and etching technologies are used to form a structure using the contact point of an oxide layer to connect the connecting points and metal wire; wherein the metal wire 53 connects the foregoing at least three p-type ion implant points 52; the first gate 54 is disposed in the metal wire 53 and between the first p-type ion implant region 52a and the second p-type ion implant region 52b; the second gate 55 is also disposed in the metal wire 53 and between the second p-type ion implant region 52b and the third p-type ion implant region 52c. The voltage control point 56 is coupled to the first p-type ion implant region 52a, the second p-type ion implant region 52b, and the third p-type ion implant region 52c; the first connecting point 57 is coupled to the first gate 54; the second connecting point 58 is coupled to the second gate 55, wherein the first connecting point 57 and the second connecting point 58 use the voltage control point 56 as the center to be disposed symmetrically on both sides of the voltage control point 56, which are also the first gate 54 and the second gate 55 and use the voltage control point 56 as the center to be disposed symmetrically on both sides of the voltage control point 56.

Further, the n-type substrate 50 at its top surface comprises an n-type ion implant region 59 coupled to a grounding point 60 for the purpose of grounding. The differential variable capacitor 5 is also designed as a whole, which has the same effect as the first preferred embodiment, and thus will not be described here.

Figure 4:
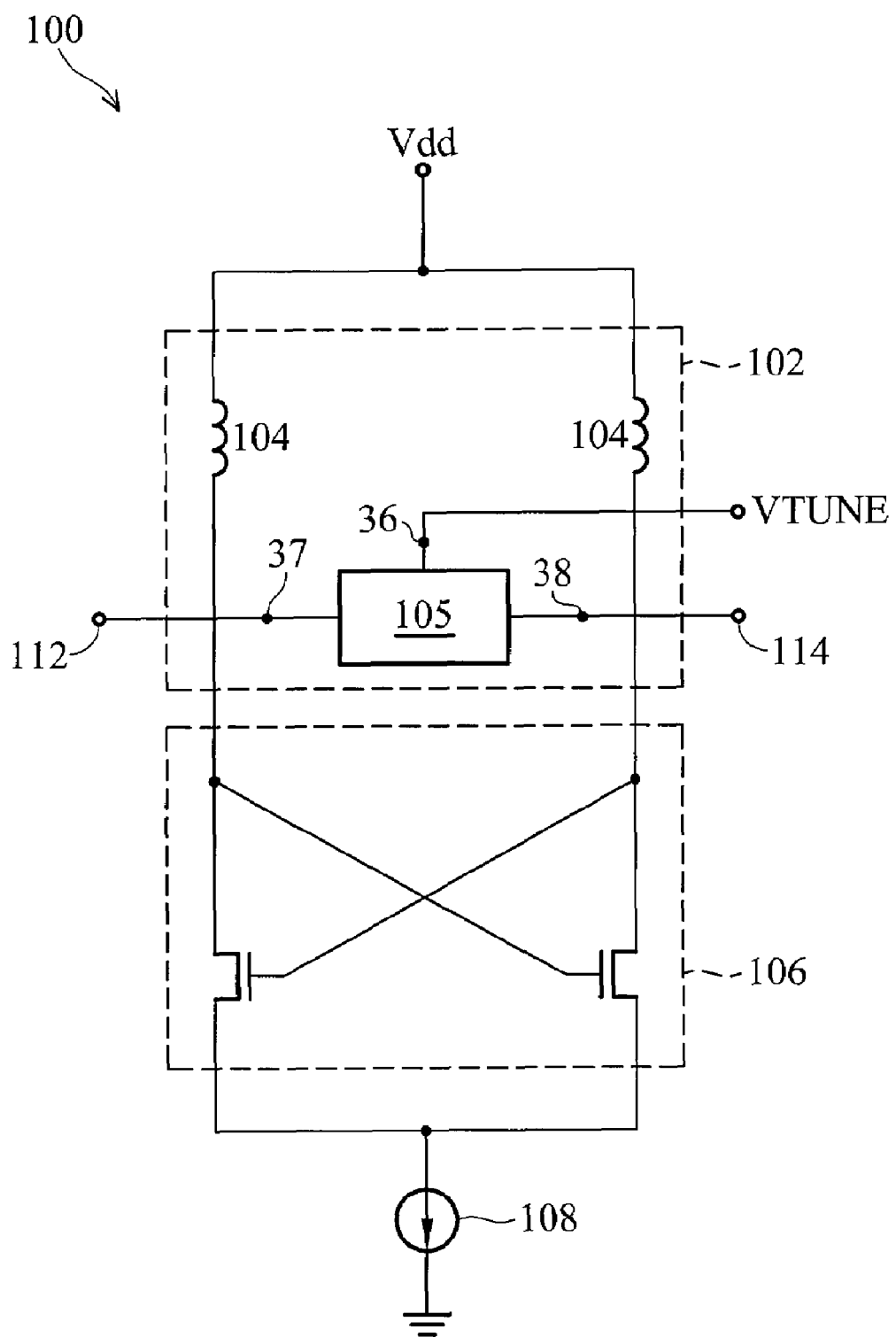
FIG. 4 is a differential variable capacitor disposed into a voltage controlled oscillator according to a third embodiment of the present invention.

Referring to FIG. 4, The VCO circuit 100 comprises a frequency tuning circuit 102, a pair of cross-coupled transistors 106, a first terminal 112 and a second terminal 114. The frequency tuning circuit 102 and the pair of cross-coupled transistor 106 are connected in parallel between the first terminal 112 and the second terminal 114. The pair of cross-coupled transistors 106 provides the necessary negative resistance to cancel the loss of the resonator. For example, the pair of cross-coupled transistor 106 consisting of two NMOS MOSFET transistors and their gates are coupled to the drain of the other in respectively. The frequency tuning circuit 102 comprises two inductors 104 connecting to the drain of the pair of cross-coupled transistors 106 in respective and the differential variable capacitor 105 connecting to the pair of cross-coupled transistors 106 in parallel. The VCO circuit 100 is disposed between two electric potential terminals, such as a power terminal Vdd and a ground terminal shown in FIG. 4. And a constant current power source 108 is disposed between the circuit 100 and one of the electric potential terminals. All circuit elements of the VCO circuit 100 are symmetrically disposed between the first terminal and the second terminal. More particularly, the frequency tuning circuit 102 and the pair of cross-coupled transistors 106 are symmetrically disposed between the first terminal and the second terminal.

The differential variable capacitor 105 is formed on a semiconductor substrate having a deep-implant region and three light-implant regions. The deep-implant region is disposed on the surface of the semiconductor substrate and the light-implant regions is further disposed on the deep-implant region. Similar to the differential variable capacitor 3 shown in FIGS. 2A and 2B, the semiconductor substrate is a p-type substrate, the deep-implant region is n-well region and the light-implant regions are the n-type ion implant regions. Or, the semiconductor substrate is an n-type substrate, the deep-implant region is p-well region and the light-implant regions are the p-type ion implant regions as the differential variable capacitor 5 show in FIGS. 3A and 3B. A voltage control terminal connects to those three light-implant regions and receives a predetermined control signal VTUNE from a control circuit, such as an analog baseband (ABB) circuit. The differential variable capacitor 105 also comprises a first gate on the deep-implant region connecting to the first terminal and a second gate on the deep-implant connecting to the second terminal. The differential variable capacitor 5 is symmetrically disposed in the VCO circuit 100. Similarly to the above-mentioned embodiments, the first gate and second gate are disposed symmetrically on opposite side of the voltage control terminal to achieve the symmetric arrangement in the VCO circuit 100.

Figure 5:
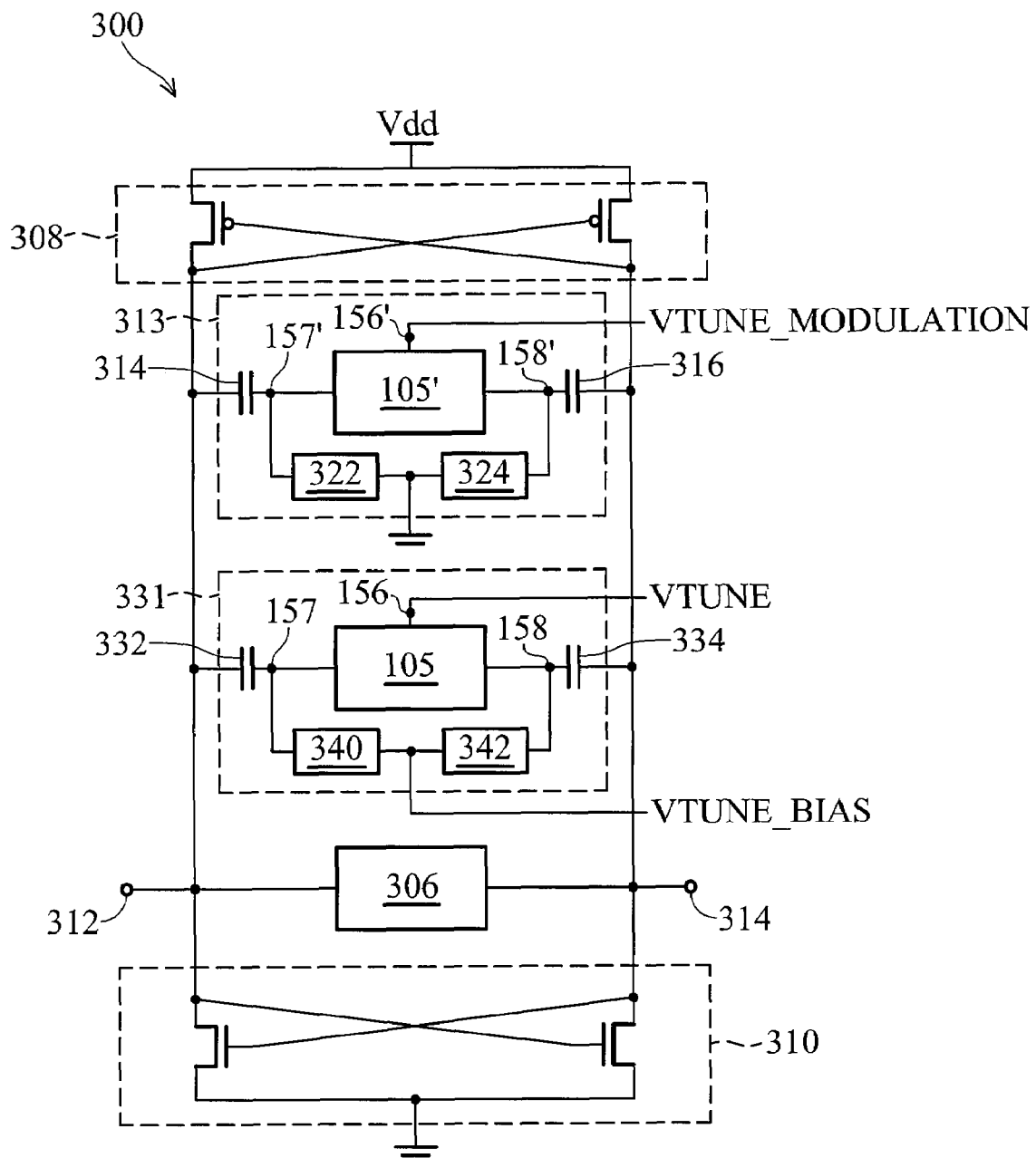
FIG. 5 is a differential variable capacitor disposed into a voltage controlled oscillator according to a fourth embodiment of the present invention.

Referring to FIG. 5, the differential variable capacitor 105 disposed into another VCO circuit 300. The VCO circuit 300 comprises an inductor 306, a modulating circuit 313, two pair of cross-coupled transistor 308, 310, a frequency tuning circuit 331, coupling in parallel between a first terminal 312 and a second terminal 314. The topology of the VCO circuit 300 has excellent symmetry in that the circuit designs of the cross-coupled transistors 308 and 310, the modulating circuit 313, the frequency tuning circuit 331, and the inductor 306 are symmetrical designs. This symmetrical VCO design reduces the even-mode VCO harmonics, and significantly reduces the flicker noise in the VCO output compared to conventional VCO designs. It is understood that the inductance module 306 provides a predetermined inductance to the circuit 300 and connects to both terminals on two sides thereof.

Similarly, a differential variable capacitor 105 is disposed into the frequency tuning circuit 331, similar to the embodiment shown in FIG. 4. The frequency tuning circuit 331 of the VCO circuit 300 controls the output frequency and phase. The output frequency of the first terminal and the second terminal is adjusted through the control of two signals VTUNE_BIAS and VTUNE. With the VTUNE signal provided by the PLL module, it is used to a closed-control loop to maintain the output frequency and phase stability. Capacitors 332 and 334 are respectively coupled in series with the differential variable capacitor 105, thereby increasing circuit linearity. The capacitors 332 and 334 are also in series with resistors 340 and 342, respectively. The resistor 340 and the capacitor 332 combination can be seen as the low-pass filters that are used to eliminate external noise. The VTUNE_BIAS signal may be provided by a voltage source external to the circuit 300 and supplies a relatively fixed voltage through the resistors 340 and 342 to terminals 157 and 158 of the differential variable capacitor 105, which connect to the capacitor 332 and, and to the capacitor 334 respectively. Besides, the voltage control terminal 156 of the differential variable capacitor 105 couples to the VTUNE. It is understood that the voltage level provided by the voltage source is dependent upon the type of variable capacitor in the VCO circuit 300, such as PN-junction, standard mode p/nMOS, or accumulation mode p/nMOS variable capacitor.

This stable frequency tuning bias signal VTUNE_BIAS provides a reference voltage and along with the signal VTUNE help to alter the capacitance of the differential variable capacitor 105 thereby tuning the output frequency of the circuit 300 to a predetermined frequency. It should be understood that the output frequency is determined collectively by all the capacitors, variable capacitor, and inductors of the circuit 300, and the use of VTUNE and VTUNE_BIAS is only one way to adjust the frequency. Furthermore, the provided VTUNE_BIAS signal helps to stabilize the output and avoid flicker noise. As it is understood, a proper choice of the electrical characteristics of the VCO circuit may significantly reduce the up-conversion of flicker noise.

The circuit 313 provides a high linearity varactor circuit capable of utilizing any modulation type. Furthermore, another differential variable capacitor 105' may be also disposed in the modulating circuit 313, similar to the differential variable capacitor 105 in the frequency tuning circuit 331. More particularly, the differential variable capacitor 105' is also coupled with resistors 322 and 324 respectively. The resistor 322 supplies a determinable or relatively fixed voltage at a terminal 157' of the differential variable capacitor 105, which connects the capacitor 314, while the resistor 324 supplies a determinable or relatively fixed voltage at a terminal 158' of the differential variable capacitor 105, which connects the capacitor 316. There are two low pass filters within this structure for eliminating external noises: the resistor 322 and the capacitor 314, and the resistor 324 and the capacitor 316. As shown, the differential variable capacitor 105' is coupled in a substantially parallel fashion with the resistors 322 and 324. The circuit 300 output is modulated by applying the modulation signal VTUNE_MODULATION to a voltage control terminal 156' of the differential variable capacitor 105'. The voltage applied thereto changes the capacitance values of the differential variable capacitor 105'. As the capacitance changes, the frequency is also altered. It is understood that the VCO output frequency can be modulated using AM (amplitude modulation), FM (frequency modulation), FSK (frequency shift keying) or other modulation types.

In view of the description above, the present invention discloses an integrated circuit design of a differential variable capacitor, which is applicable for both the n-type semiconductor substrate and the p-type semiconductor substrate. The present invention uses an integrated method to design an integrated circuit of the differential variable capacitor to effectively reduce the chip size and lower the manufacturing cost. The present invention can prevent asymmetrical coils, and allows us to know about the factor of overall loading quality of the variable capacitor, and further effectively control the overall loading quality of the variable capacitor.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A voltage controlled oscillator (VCO) module coupled between a power terminal and a grounding terminal, and having a first terminal and a second terminal, comprising:
   a frequency tuning circuit containing a differential variable capacitor for receiving a predetermined tuning signal for altering capacitances of the differential variable capacitor, wherein the differential variable capacitor comprising:
      a semiconductor substrate having a first conductive type;
      a well region having a second conductive type, disposed on the top surface of said semiconductor substrate;
      at least three implant regions, including a first implant region, a second implant region and a third implant region each disposed on the top surface of said well region;
      a voltage control terminal connecting to said first implant region, said second implant region and said third implant region;
      a first gate coupled to the first terminal and formed on the well region between the first implant region and the second implant region;
      a second gate coupled to the second terminal and formed on the well region between the second implant region and the third implant region; and
   a core circuit coupled in parallel with the frequency tuning circuit for providing an oscillation mechanism, wherein the first implant region and the third implant region use the second implant region as a center to be disposed symmetrically on both sides of the second implant region, and the first gate and second gate use the voltage control terminal as a center to be disposed symmetrically on both sides of the voltage control terminal.

2. The VCO module of claim 1 further comprising: a modulating circuit coupled in parallel with the frequency tuning circuit and the core circuit containing one or more variable capacitors, wherein the variable capacitors are tuned to deliver the first terminal and the second terminal at a frequency.

3. The VCO module of claim 1, wherein said first gate and said second gate are made of a polysilicon.

4. The VCO module of claim 1, wherein the semiconductor substrate is a p-type substrate, the well region is a n-well region, and the first implant region, the second implant region and the third implant region are n-type ion implant regions.

5. The VCO module of claim 4, wherein said p-type substrate further comprises a p-type ion implant region arranged on the p-type substrate and the p-type implant region coupled to the grounding terminal.

6. The VCO of claim 1, wherein the semiconductor substrate is a n-type substrate, the well region is a p-well region, and the first implant region, the second implant region and the third implant region are p-type ion implant regions.

7. The VCO module of claim 6, wherein said n-type substrate further comprises a n-type ion implant region arranged on n-type substrate and the n-type implant region coupled to the grounding terminal.

8. The VCO module of claim 1, wherein the core circuit comprising a pair of cross-coupled transistors.

9. The VCO module of claim 1, wherein the frequency tuning circuit further comprising:
   a first low-pass filter coupled the first gate and the first terminal; and
   a second low-pass filter coupled the second gate and the second terminal, wherein the first low-pass filter and the second low-pass filter are symmetrically arranged.

10. The VCO module of claim 2, wherein the modulating circuit comprising:
   a second differential variable capacitor having a second voltage control terminal, a third gate, and a fourth gate, wherein said third gate and said fourth gate are disposed symmetrically on opposite side of said second voltage control terminal; a third low-pass filter coupling to the first terminal and the third gate; and
   a fourth low-pass filter coupling to the second terminal and the fourth gate, wherein the third low-pass filter and fourth low-pass filter are symmetrically arranged.

* * * * *